(12) United States Patent
Huang et al.

(10) Patent No.: US 12,057,521 B2
(45) Date of Patent: Aug. 6, 2024

(54) SUPERLATTICE LAYER, LED EPITAXIAL STRUCTURE, DISPLAY DEVICE, AND METHOD FOR MANUFACTURING LED EPITAXIAL STRUCTURE

(71) Applicant: CHONGQING KONKA PHOTOELECTRIC TECHNOLOGY RESEARCH INSTITUTE CO., LTD., Chongqing (CN)

(72) Inventors: Wen Yang Huang, Chongqing (CN); Ya-Wen Lin, Chongqing (CN); Kuo-Tung Huang, Chongqing (CN); Chia-Hung Huang, Chongqing (CN); Shun-Kuei Yang, Chongqing (CN)

(73) Assignee: CHONGQING KONKA PHOTOELECTRIC TECHNOLOGY RESEARCH INSTITUTE CO., LTD., Chongqing (CN)

(*) Notice: Subject to any disclaimer, the term of this patent is extended or adjusted under 35 U.S.C. 154(b) by 483 days.

(21) Appl. No.: 17/347,238

(22) Filed: Jun. 14, 2021

(65) Prior Publication Data

US 2021/0367100 A1    Nov. 25, 2021

Related U.S. Application Data

(63) Continuation of application No. PCT/CN2020/092330, filed on May 26, 2020.

(30) Foreign Application Priority Data

May 22, 2020    (CN) .......................... 202010443852.3

(51) Int. Cl.
*H01L 33/06*    (2010.01)
*C30B 25/16*    (2006.01)
(Continued)

(52) U.S. Cl.
CPC ............ *H01L 33/06* (2013.01); *C30B 25/165* (2013.01); *C30B 29/403* (2013.01);
(Continued)

(58) Field of Classification Search
CPC ... C30B 25/165; C30B 29/403; C30B 29/406; C30B 29/68; H01L 33/06; H01L 33/007; H01L 33/12; H01L 33/32
See application file for complete search history.

(56) References Cited

U.S. PATENT DOCUMENTS

| 8,692,228 B2 | 4/2014 | Kaneko et al. |
| 2008/0025360 A1* | 1/2008 | Eichler .................. H01L 33/32 257/15 |

(Continued)

FOREIGN PATENT DOCUMENTS

| CN | 103441197 A | 12/2013 |
| CN | 103474539 A | 12/2013 |

(Continued)

OTHER PUBLICATIONS

Wang Lai, etc., Study on electrical properties of n2GaN grown at low temperature by metal-organic vapor phase epitaxy, Sep. 15, 2008.

(Continued)

*Primary Examiner* — Shaun M Campbell
(74) *Attorney, Agent, or Firm* — HAUPTMAN HAM, LLP

(57) ABSTRACT

This disclosure relates to a superlattice structure, an LED epitaxial structure, a display device, and a method for manufacturing the LED epitaxial structure. The superlattice structure includes at least two superlattice units which are grown in stacking layers. Each of the at least two superlattice units includes a first n-type GaN layer, a second n-type GaN layer, a first n-type GaInN layer, and a second n-type
(Continued)

GaInN layer which are grown in stacking layers. The first n-type GaN layer has a doping concentration which is constant along a growth direction, the second n-type GaN layer has a doping concentration which gradually increases along the growth direction, the first n-type GaInN layer has a doping concentration which gradually decreases along the growth direction, and the second n-type GaInN layer has a doping concentration which is constant along the growth direction.

20 Claims, 3 Drawing Sheets

(51) Int. Cl.
   *C30B 29/40* (2006.01)
   *C30B 29/68* (2006.01)
   *H01L 33/00* (2010.01)
   *H01L 33/12* (2010.01)
   *H01L 33/32* (2010.01)

(52) U.S. Cl.
   CPC ............ *C30B 29/406* (2013.01); *C30B 29/68* (2013.01); *H01L 33/007* (2013.01); *H01L 33/12* (2013.01); *H01L 33/32* (2013.01)

(56) References Cited

U.S. PATENT DOCUMENTS

| | | | |
|---|---|---|---|
| 2009/0166606 A1 | 7/2009 | Lee | |
| 2010/0044674 A1* | 2/2010 | Kim | H01L 33/04 257/14 |
| 2012/0037881 A1* | 2/2012 | Kim | H01L 33/04 438/45 |
| 2014/0361247 A1* | 12/2014 | Choi | H01L 33/0025 257/13 |
| 2016/0064598 A1* | 3/2016 | Choi | H01L 33/0025 257/13 |
| 2017/0092807 A1* | 3/2017 | Okuno | H01L 33/0025 |

FOREIGN PATENT DOCUMENTS

| | | |
|---|---|---|
| CN | 104319330 A | 1/2015 |
| CN | 104465914 A | 3/2015 |
| CN | 106611808 A | 5/2017 |
| CN | 106784171 A | 5/2017 |
| CN | 106785912 A | 5/2017 |
| CN | 109148657 A | 1/2019 |
| CN | 109524520 A | 3/2019 |
| CN | 109980056 A | 7/2019 |
| KR | 20100022913 A | 3/2010 |
| KR | 20150022814 A | 3/2015 |
| KR | 101924372 B1 | 12/2018 |

OTHER PUBLICATIONS

The first office action issued in corresponding CN application No. 2020104438523 dated Jan. 24, 2022.

Notice of allowance issued in corresponding KR application No. 10-2021-7018457 dated Mar. 2, 2023.

International Search Report issued in corresponding International Application No. PCT/CN2020/092330, mailed Feb. 25, 2021, pp. 1-9, Beijing, China.

* cited by examiner

SUPERLATTICE LAYER, LED EPITAXIAL STRUCTURE, DISPLAY DEVICE, AND METHOD FOR MANUFACTURING LED EPITAXIAL STRUCTURE

CROSS-REFERENCE TO RELATED APPLICATIONS

The present application is a continuation of International Application No. PCT/CN2020/092330, filed on May 26, 2020, which claims priority to Chinese Patent Application No. 202010443852.3, filed on May 22, 2020, the disclosures of which are hereby incorporated by reference in their entireties.

TECHNICAL FIELD

This disclosure relates to the technical field of light emitting diodes, in particular to a superlattice layer, an LED epitaxial structure with the superlattice layer, a display device with the LED epitaxial structure, a method for manufacturing the superlattice layer, and a method for manufacturing the LED epitaxial structure.

BACKGROUND

With the development of science and technology, light-emitting diodes (LED) are widely used in display elements due to their good stability, long service life, low power consumption, high color saturation, fast response speed, and high contrast. The existing LED chips all contain LED epitaxial structures. The LED epitaxial structure is a single crystal thin film grown on a substrate which has been heated to an appropriate temperature. A material of the substrate for the LED epitaxial structure is a basis for the development of LED technology. The material of the substrate determines the development direction of LED.

The existing blue LED epitaxial structure is mainly formed by sequentially growing a gallium nitride (GaN) buffer layer, an undoped GaN layer, an n-type doped GaN layer, and other structures on a sapphire substrate, and is used to manufacture an LED element. However, a lattice mismatch is raised due to different lattice constants of the sapphire substrate and the LED epitaxial layer. There is a large lattice mismatch between the sapphire substrate and the LED epitaxial layer. During the growth process of the existing LED epitaxial structure, since the n-type doped GaN layer is generated at one time, a large strain is induced. As a result, the n-type doped GaN layer will be displaced under the large strain, a large dislocation will generate between the n-type doped GaN layer and the substrate, and a threading dislocation will reach a multiple quantum well (MQW) region to form V-shaped defects, which will affect light-emitting characteristics.

SUMMARY

In order to overcome the above problems, the disclosure aims at providing a superlattice layer capable of reducing strains generated during growth, an LED epitaxial structure capable of reducing dislocations caused by the strains, a display device capable of improving the display effect, and a method for manufacturing the LED epitaxial structure.

The purposes of the disclosure are achieved through the following technical solutions.

A superlattice layer is provided. The superlattice layer includes at least two superlattice units which are grown in stacking layers. Each of the at least two superlattice units includes a first n-type gallium nitride (GaN) layer, a second n-type GaN layer, a first n-type gallium indium nitride (GaInN) layer, and a second n-type GaInN layer which are grown in stacking layers. The first n-type GaN layer has a doping concentration which is constant along a growth direction, the second n-type GaN layer has a doping concentration which gradually increases along the growth direction, the first n-type GaInN layer has a doping concentration which gradually decreases along the growth direction, and the second n-type GaInN layer has a doping concentration which is constant along the growth direction.

In an implementation, the at least two superlattice units have 20 to 50 superlattice units, and all the at least two superlattice units have a total thickness ranging from 50 nm to 200 nm.

In an implementation, the first n-type GaN layer has a thickness greater than the second n-type GaN layer.

In an implementation, the first n-type GaN layer has a thickness ranging from 1 nm to 4 nm.

In an implementation, the second n-type GaN layer has a thickness ranging from 0.25 nm to 1 nm.

In an implementation, the first n-type GaInN layer has a thickness ranging from 0.25 nm to 1 nm.

In an implementation, the second n-type GaInN layer has a thickness ranging from 0.5 nm to 2 nm.

In an implementation, each of the first n-type GaN layer, the second n-type GaN layer, the first n-type GaInN layer, and the second n-type GaInN layer is doped with silicon.

A light emitting diode (LED) epitaxial structure is further provided. The LED epitaxial structure includes a GaN buffer layer, an un-doped GaN layer, a bottom n-type GaN layer, the above-mentioned superlattice layer, a multi-quantum well (MQW) light-emitting layer, a low-temperature p-type GaN layer, a p-type aluminum gallium nitride (AlGaN) confinement layer, and a p-type GaN layer which are grown in stacking layers.

In an implementation, the GaN buffer layer has a thickness ranging from 20 nm to 30 nm. The undoped GaN layer has a thickness ranging from 1500 nm to 3000 nm. The bottom n-type GaN layer has a thickness ranging from 2000 nm to 2500 nm. The MQW light-emitting layer has a thickness ranging from 80 nm to 240 nm. The low-temperature p-type GaN layer has a thickness ranging from 30 nm to 60 nm. The p-type AlGaN confinement layer has a thickness ranging from 40 nm to 80 nm. The p-type GaN layer has a thickness ranging from 40 nm to 100 nm.

A method for manufacturing an LED epitaxial structure is further provided. The method is carried out as follows.

A substrate is provided. The substrate is placed into a reaction chamber. A GaN buffer layer, an un-doped GaN layer, and a bottom n-type GaN layer are grown sequentially on the substrate.

A Gallium (Ga) source and $SiH_4$ are introduced into the reaction chamber, and a first n-type GaN layer is grown on the bottom n-type GaN layer.

When growth of the first n-type GaN layer is completed, introducing $SiH_4$ is stopped, and a GaN layer is grown on the first n-type GaN layer.

When growth of the GaN layer is completed, introducing the Ga source is stopped, and a predetermined amount of $SiH_4$ re-introduced, to enable the GaN layer to form a second n-type GaN layer.

The Ga source and an indium (In) source are introduced into the reaction chamber to form a first n-type GaInN layer.

$SiH_4$ is re-introduced to form a second n-type GaInN layer, the first n-type GaN layer, the second n-type GaN layer, the first n-type GaInN layer, and the second n-type GaInN layer form a superlattice unit.

A predetermined number of superlattice units are grown on the superlattice unit formed until all the superlattice units have a total thickness reaching a predetermined value, to form a superlattice layer.

A MQW light-emitting layer, a low-temperature p-type GaN layer, a p-type AlGaN confinement layer, and a p-type GaN layer are grown sequentially on the superlattice layer.

In an implementation, the method for manufacturing the LED epitaxial structure includes the following. After the GaN buffer layer, the un-doped GaN layer, and the bottom n-type GaN layer are grown sequentially on the substrate, a temperature inside the reaction chamber is adjusted to 800° C.~950° C.

In an implementation, a predetermined number of superlattice units is grown on the superlattice unit formed until all the superlattice units have a total thickness reaching a predetermined value as follows. 20 to 50 superlattice units are grown on the superlattice unit formed until all superlattice units have the total thickness ranging from 50 nm to 200 nm.

In an implementation, the substrate is placed in the reaction chamber as follows. The temperature inside the reaction chamber is increased to 1000° C.~1200° C. Hydrogen gas is introduced. The substrate is baked for 2 to 6 minutes.

In an implementation, the GaN buffer layer, the un-doped GaN layer, and the bottom n-type GaN layer are grown sequentially on the substrate as follows. The Ga source and ammonia gas are introduced into the reaction chamber, the temperature inside the reaction chamber is decreased to 500° C.~600° C., a pressure inside the reaction chamber is adjusted to 400 mBar~700 mBar, and the GaN buffer layer is grown on the substrate. When growth of the GaN buffer layer is completed, the temperature inside the reaction chamber is increased to 1000° C.~1200° C., and a first un-doped GaN layer is grown on the GaN buffer layer. When growth of the first un-doped GaN layer is completed, the pressure inside the reaction chamber is decreased to 200 mBar~350 mBar, a second un-doped GaN layer is grown on the first un-doped GaN layer, where the first un-doped GaN layer and the second doped GaN layer form the un-doped GaN layer. When growth of the second un-doped GaN layer is completed, $SiH_4$ is introduced and the bottom n-type GaN layer is grown on the second un-doped GaN layer.

In an implementation, when growth of the superlattice layer is completed, the MQW light-emitting layer, the low-temperature p-type GaN layer, the p-type AlGaN confinement layer, and the p-type GaN layer are grown sequentially on the superlattice layer as follows. The temperature inside the reaction chamber is adjusted to 730° C.~900° C. and the MQW light-emitting layer is grown. When growth of the MQW light-emitting layer is completed, the temperature inside the reaction chamber is adjusted to 730° C.~830° C., the Ga source and a magnesium (Mg) source are introduced, and the low-temperature p-type GaN layer is grown on the MQW light-emitting layer. When growth of the low-temperature p-type GaN layer is completed, the temperature inside the reaction chamber is adjusted to 900° C.~1050° C. and the pressure inside the reaction chamber is adjusted to 50 mBar~150 mBar, an aluminum (Al) source, the Ga source, and the Mg source are introduced, and the p-type AlGaN confinement layer is grown on the low-temperature p-type GaN layer. When growth of the p-type AlGaN confinement layer is completed, the temperature inside the reaction chamber is adjusted to 850° C.~1000° C., the Ga source and the Mg source are introduced, and the p-type GaN layer is grown on the p-type AlGaN confinement layer.

In an implementation, the Ga source is trimethylgallium.

A display device is further provided. The display device includes a display backplane on which more than one LED chip is mounted, where each of the more than one LED chip is provided with the above-mentioned LED epitaxial structure.

The superlattice layer in the LED epitaxial structure of the disclosure includes multiple superlattice units, and the n-type GaN layer in the superlattice layer is intermittently grown, such that stresses in the epitaxial structure can be effectively released when growth of the n-type GaN layer is suspended. As such, dislocations between the n-type GaN layer and the substrate due to the stresses can be reduced, thereby significantly reducing the V-shape defects in a MQW region in the LED epitaxial structure and effectively ensuring the light-emitting performance of the LED.

BRIEF DESCRIPTION OF THE DRAWINGS

For ease of description, the disclosure is described in detail with reference to the following preferred implementations and drawings.

DETAILED DESCRIPTION

Objectives, technical solutions, and advantages of the disclosure will be described clearly and completely hereinafter with reference to the accompanying drawings in the implementations of the disclosure. It is noted that the implementations described herein are used to merely explain rather than limit the disclosure.

It is noted that, in the description of the disclosure, directional terms such as "center", "longitudinal", "lateral", "length", "width", "thickness", "up", "down", "front", "rear", "left", "right", "vertical", "horizontal", "top", "bottom", "inner", "outer", "clockwise", "counterclockwise", and the like referred to herein are only for reference to directions illustrated in accompanying drawings. Thus, the directional terms adopted are for describing and understanding the disclosure better and more clearly, rather than explicitly or implicitly indicate that apparatuses or components referred to herein must have a certain direction or be configured or operated in a certain direction and therefore cannot be understood as limitation on the disclosure. In addition, terms "first" and "second" are merely used for descriptive purposes, and should not be understood as indicating or implying relative importance or implicitly indicating the number of technical features indicated. Therefore, the feature defined with the term "first" or "second" may explicitly or implicitly include one or more of the features. In the description of the implementations of the disclosure, the terms "a plurality of" and "multiple" means that that the number is two or more (for example, two or three), unless otherwise clearly specified.

It is noted that, in the description of the disclosure, terms such as "installing", "coupling", "connecting", "interconnect" should be understood in broader sense. For example, coupling may be a fixed coupling, a removable coupling, or an integrated coupling, may be a mechanical coupling or an electrical coupling, and may be a direct coupling, an indirect coupling through a medium, or a communication coupling between two components, unless stated otherwise. When a component is "fixed to" or "disposed on" another component, it can be directly on the other component or indirectly on the other component through a medium. When a component is "connected" to another component, it can be directly connected to the other component or indirectly connected to the other component through a medium. For those of ordinary skill in the art, the above terms in the disclosure can be understood according to specific situations.

Figure 1:
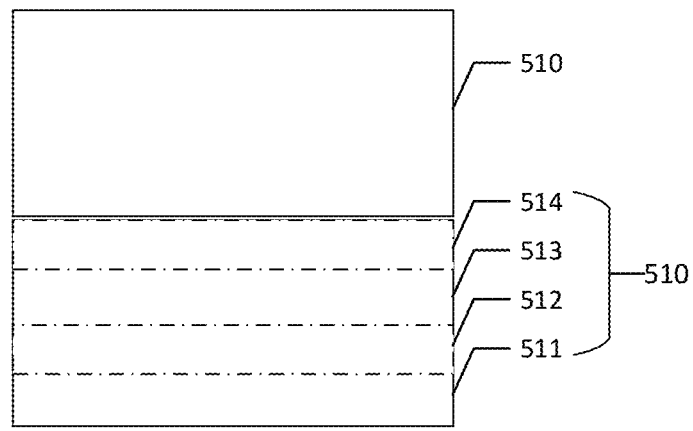
FIG. 1 is a schematic cross-sectional view of a superlattice layer of the disclosure.

A superlattice layer of the disclosure is described in detail hereinafter. Referring to FIG. 1, the superlattice layer 500 includes 20-50 superlattice units 510 grown in stacking layer. Adjacent superlattice units 510 are aligned with one another. Orthographic projections of all superlattice units 510 on the horizontal plane coincide with each other. The superlattice layer 500 has a total thickness of 50 nm~200 nm. The superlattice refers to a single crystal formed by a group of multi-layer thin films periodically arranged. Each of the multi-layer thin films has a thickness ranging from a few to dozens of atomic layers. Main semiconductor properties of each layer such as band gap and doping level can be controlled independently. A grow period of the multi-layer film can be controlled manually, such that an artificial crystal structure (i.e., the superlattice) is obtained.

Each of the superlattice units 510 includes a first n-type GaN layer 511. The first n-type GaN layer 511 has a thickness of 1 nm~4 nm. A second n-type GaN layer 512 is grown on the first n-type GaN layer 511. A thickness of the second n-type GaN layer 512 is not greater than the thickness of the first n-type GaN layer 511. The second n-type GaN layer 512 has the thickness of 0.25 nm~1 nm. The first n-type GaN layer 511 and the second n-type GaN layer 512 have different doping concentrations. Due to advantages such as a wide direct band gap, strong atomic bonds, high thermal conductivity, good chemical stability, and strong anti-radiation abilitye, GaN has broad application prospects in optoelectronics, high-temperature high-power elements, and high-frequency microwave elements. A first n-type gallium indium nitride (GaInN) layer 513 is grown on the second n-type GaN layer 512. The first n-type GaInN layer 513 has a thickness of 0.25 nm~1 nm. A second n-type GaInN layer 514 is grown on the first n-type GaInN layer 513. The second n-type GaInN layer 514 has a thickness of 0.5 nm~2 nm.

The first n-type GaN layer 511 has a doping concentration which is constant along a growth direction. The second n-type GaN layer 512 has a doping concentration which gradually increases along the growth direction. The first n-type GaInN layer 513 has a doping concentration which gradually decreases along the growth direction. The second n-type GaInN layer 514 has a doping concentration which is constant along the growth direction.

In this implementation, both the first n-type GaN layer 511 and the first n-type GaInN layer 513 are obtained by directly doping $SiH_4$ in GaN and GaInN respectively. The second n-type GaN layer 512 and the second n-type GaInN layer 514 are obtained indirectly by diffusion of SiH4 between GaN and GaInN into GaN and GaInN respectively. Each of the first n-type GaN layer 511, the second n-type GaN layer 512, the first n-type GaInN layer 513, and the second n-type GaInN layer 514 is doped with Silicon, where the a doping source is $SiH_4$. $SiH_4$, as a gas source that provides silicon components, can be used to produce high-purity polycrystalline silicon, single crystal silicon, microcrystalline silicon, amorphous silicon, silicon nitride, silicon oxide, heterogeneous silicon, and various metal silicides.

In this implementation, since the superlattice layer 500 includes multiple superlattice units 510, the superlattice unit 510 needs to be generated multiple times during generation of the superlattice layer 500. In this way, more efficient relief of the stresses generated during the generation of the superlattice layer 500 can be realized, and the stacking of dislocations can be reduced.

Figure 2:
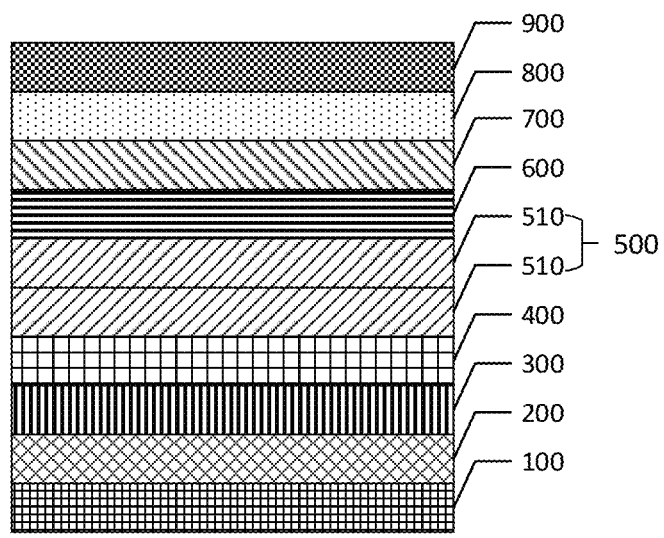
FIG. 2 is a schematic cross-sectional view of an LED epitaxial structure of the disclosure.

Referring to FIG. 2, the LED epitaxial structure of the disclosure is described in detail with an implementation below.

The LED epitaxial structure includes a GaN buffer layer 200, an un-doped GaN layer 300, a bottom n-type GaN layer 400, a superlattice layer 500, a MQW light-emitting layer 600, a low-temperature p-type GaN layer 700, a p-type AlGaN confinement layer 800, and a p-type GaN layer 900 which are grown sequentially on a sapphire substrate 100. In this implementation, the GaN buffer layer 200 has a thickness of 20 nm~30 nm. The GaN layer has a thickness of 1500 nm~3000 nm. The bottom n-type GaN layer 400 has a thickness of 2000 nm~2500 nm. The MQW light-emitting layer 600 has a thickness of 80 nm~240 nm. The low-temperature p-type GaN layer 700 has a thickness of 30 nm~60 nm. The p-type AlGaN confinement layer 800 has a thickness of 40 nm~80 nm. The p-type GaN layer 900 has a thickness of 40 nm~100 nm. Each of the low-temperature p-type GaN layer 700, the p-type AlGaN confinement layer 800, and the p-type GaN layer 900 is doped with magnesium (Mg).

The superlattice layer 500 includes 20-50 superlattice units 510 which are grown in stacking layers. Each of the superlattice units 510 includes: a first n-type GaN layer 511, a second n-type GaN layer 512, a GaInN layer 513, and an n-type GaInN layer 514 which are sequentially grown in stacking layer. The first n-type GaN layer 511 has a thickness of 1 nm~4 nm. The second n-type GaN layer 512 has a thickness of 0.25 nm~1 nm. The GaInN layer 513 has a thickness of 0.25 nm~1 nm. The n-type GaInN layer 514 has a thickness of 0.5 nm~2 nm.

Figure 3:
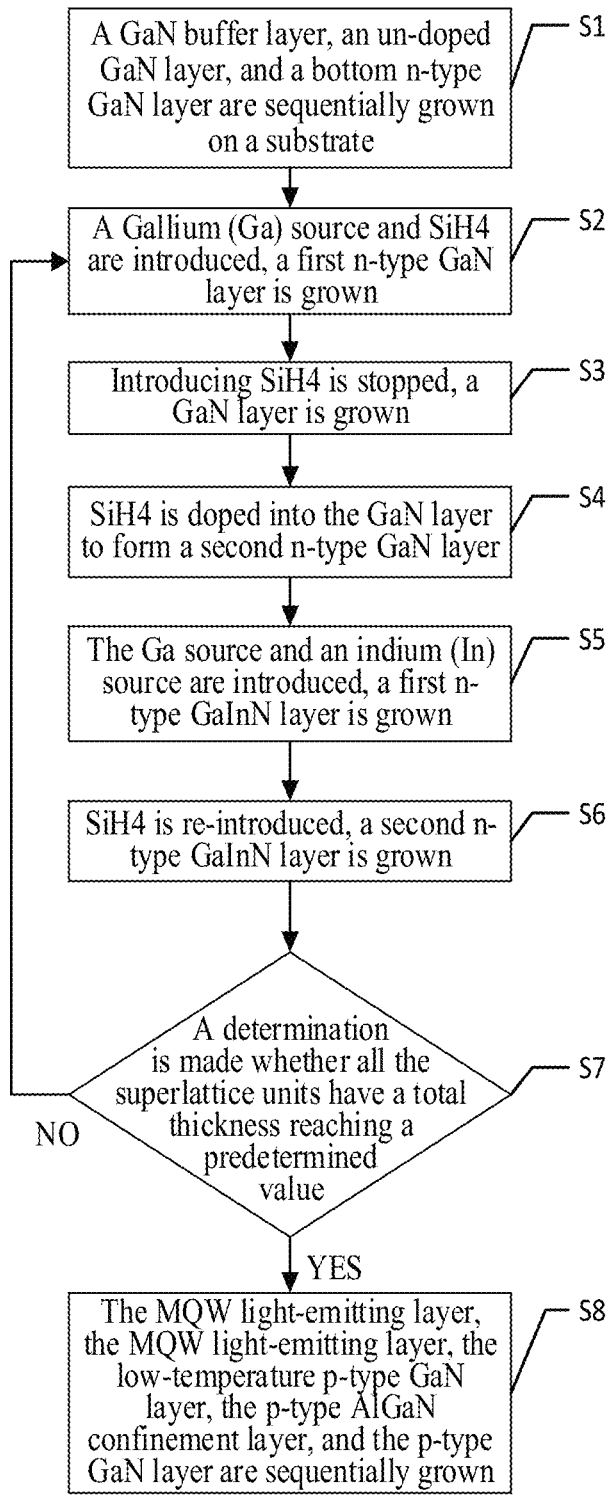
FIG. 3 is a schematic flow chart of a method for manufacturing an LED epitaxial structure of the disclosure.

Referring to FIG. 3, a method for manufacturing an LED epitaxial structure of the disclosure is described in detail with an implementation below. The method for manufacturing the LED epitaxial structure begins at block S1.

At block S1, a GaN buffer layer, an un-doped GaN layer, and a bottom n-type GaN layer are sequentially grown on a substrate.

The substrate is provided. The substrate is a sapphire substrate. The substrate is placed into the reaction chamber. The temperature inside the reaction chamber is raised to 1000° C.~1200° C., hydrogen gas is introduced, and the substrate is baked for 2 to 6 minutes. The GaN buffer layer, the un-doped GaN layer, and the bottom n-type GaN layer are then sequentially grown on the substrate.

At block S2, a Gallium (Ga) source and $SiH_4$ are introduced, a first n-type GaN layer is grown.

A temperature inside the reaction chamber is adjusted to 800° C.~950° C., the Ga source and an indium (In) source are introduced into the reaction chamber, the first n-type GaN layer is grown on the bottom n-type GaN layer. $SiH_4$ is doped into a GaN layer during generation of the GaN layer, so as to form the first n-type GaN layer. The growth of the first n-type GaN layer is completed until the first n-type GaN layer has a thickness of 1 nm~4 nm. In this implementation, the Ga source is trimethylgallium.

At block S3, introducing $SiH_4$ is stopped, a GaN layer is grown.

When the growth of the first n-type GaN layer is completed, introducing $SiH_4$ is stopped, the GaN layer is grown on the first n-type GaN layer, and growth of the GaN layer is completed until the GaN layer has a thickness of 0.25 nm~1 nm.

At S4, $SiH_4$ is doped into the GaN layer to form a second n-type GaN layer.

When the growth of the GaN layer is completed, introducing the Ga source is stopped, $SiH_4$ is re-introduced for 5 to 20 seconds to enable $SiH_4$ to be doped into the GaN layer to form the second n-type GaN layer. In this operation, the second n-type GaN layer is formed by doping $SiH_4$ into the GaN, such that stresses generated during growth can be effectively released.

At S5, the Ga source and an indium (In) source are introduced, a first n-type GaInN layer is grown.

The Ga source and the In source are introduced into the reaction chamber to form a GaInN layer. During growth of the GaInN layer, $SiH_4$ below the GaInN layer dopes into the GaInN layer to form the first n-type GaInN layer. Growth of the first n-type GaInN layer is completed until the first n-type GaInN layer has a thickness of 0.25 nm~1 nm.

At S6, $SiH_4$ is re-introduced, a second n-type GaInN layer is grown.

When growth of the GaInN layer is completed, $SiH_4$ is re-introduced, the second n-type GaInN layer is grown on the GaInN layer. That is, during the growth of the GaInN layer, $SiH_4$ is doped into the GaInN layer to form the second n-type GaInN layer. Growth of the second n-type GaInN layer is completed until the second n-type GaInN layer has a thickness of 0.5 nm~2 nm.

At S7, a determination is made whether all the superlattice units have a total thickness reaching a predetermined value.

The first n-type GaN layer, the second n-type GaN layer, the first n-type GaInN layer, and the second n-type GaInN layer form a superlattice unit. A predetermined number of superlattice units are grown on the superlattice unit formed. The determination is made whether all the superlattice units have a total thickness reaching the predetermined value. The method for manufacturing the LED epitaxial structure may advance to block S8 based on a determination that the total thickness reaches the predetermined value. At block S8, a MQW light-emitting layer, a low-temperature p-type GaN layer, a p-type AlGaN confinement layer, and a p-type GaN layer are sequentially grown. The method for manufacturing the LED epitaxial structure may return to block S2 based on a determination that the total thickness does not reach the predetermined value. At block S2, the Ga source and $SiH_4$ are introduced, the first n-type GaN layer are grown. In this implementation, the predetermined number is ranged from 20 to 50. In other words, there are 20 to 50 superlattice units are grown on the superlattice unit formed until the superlattice layer has the total thickness of 50 nm~200 nm.

At block S8, the MQW light-emitting layer, the MQW light-emitting layer, the low-temperature p-type GaN layer, the p-type AlGaN confinement layer, and the p-type GaN layer are sequentially grown.

When growth of the superlattice layer is completed, the MQW light-emitting layer, the low-temperature p-type GaN layer, the p-type AlGaN confinement layer, and the p-type GaN layer are sequentially grown on the superlattice layer.

In this implementation, the superlattice layer is grown by an interrupted mode, an interrupted mode of doping first and then undoping, and a doped mode, such that stresses generated during the growth of the superlattice layer can be effectively released, and the stacking of dislocations can be reduced. In this way, the V-shaped defects in the MQW light-emitting layer can be significantly reduced, and small defect density can be achieved by above doping mode, such that the luminous efficiency and antistatic performance of the LED can be significantly improved.

Figure 4:
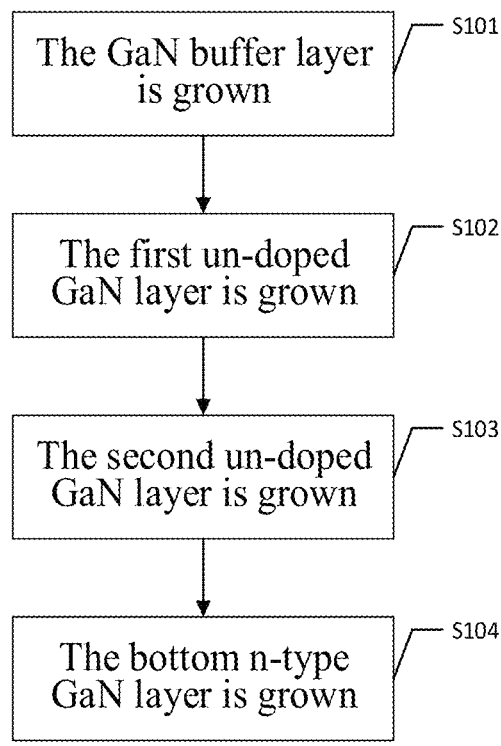
FIG. 4 is a schematic flow chart of block S1 of the disclosure.

Referring to FIG. 4, at block S1, the GaN buffer layer, the un-doped GaN layer, and the bottom n-type GaN layer are sequentially grown on the substrate as follows.

At S101, the GaN buffer layer is grown.

The Ga source and ammonia gas are introduced into the reaction chamber, the temperature inside the reaction chamber is decreased to 500° C.~600° C., a pressure inside the reaction chamber is adjusted to 400 mBar~700 mBar, and the GaN buffer layer is grown on the substrate. The growth of the GaN buffer layer is completed until the GaN buffer layer has a thickness of 20 nm~30 nm. In this implementation, the ratio of the Ga source to the ammonia gas is between 1:100~1:1000.

At S102, the first un-doped GaN layer is grown.

When the growth of the GaN buffer layer is completed, the temperature inside the reaction chamber is increased to 1000° C.~1200° C., the first un-doped GaN layer is grown on the GaN buffer layer. Growth of the first un-doped GaN layer is completed until the first un-doped GaN layer has a thickness of 500 nm~100 nm.

At S103, the second un-doped GaN layer is grown.

When the growth of the first un-doped GaN layer is completed, the pressure inside the reaction chamber is decreased to 200 mBar~350 mBar, the second un-doped GaN layer is grown on the first un-doped GaN layer. The growth of the second un-doped GaN layer is completed until the second un-doped GaN layer has a thickness of 1000 nm~2000 nm. In this implementation, the first un-doped GaN layer and the second doped GaN layer form the un-doped GaN layer.

At S104, the bottom n-type GaN layer is grown.

When growth of the second un-doped GaN layer is complete, $SiH_4$ is introducedd, the bottom n-type GaN layer is grown on the second un-doped GaN layer.

Figure 5:
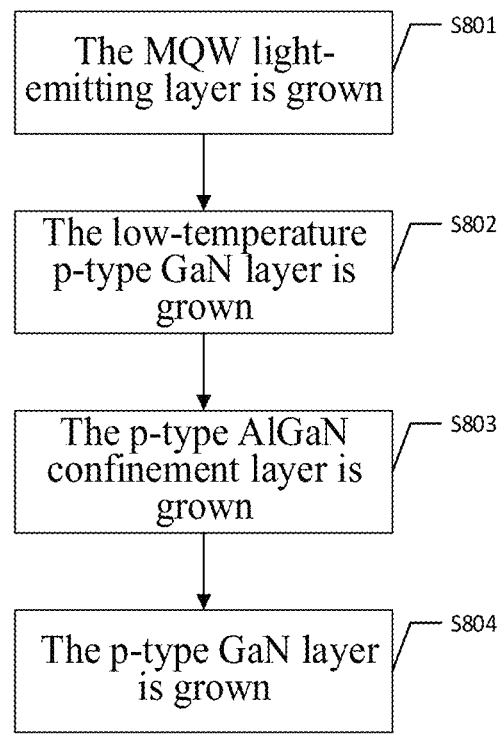
FIG. 5 is a schematic flow chart of block S8 of the disclosure.

Referring to FIG. 5, at block S8, the MQW light-emitting layer, the low-temperature p-type GaN layer, the p-type AlGaN confinement layer, and the p-type GaN layer are grown sequentially as follows.

At S801, the MQW light-emitting layer is grown.

The temperature inside the reaction chamber is adjusted to 730° C.~900° C. A GaN/GaInN MQW layer is grown for 5 to 15 periods until the GaN/GaInN MQW layer has a thickness of 80 nm~240 nm.

At S802, the low-temperature p-type GaN layer is grown.

When the growth of the MQW light-emitting layer is completed, the temperature inside the reaction chamber is adjusted to 730° C.~830° C., the Ga source and a magnesium (Mg) source are introduced, and the low-temperature p-type GaN layer is grown on the MQW light-emitting layer. Growth of the low-temperature p-type GaN layer is completed until the low-temperature p-type GaN layer has a thickness of 30 nm~60 nm.

At S803, the p-type AlGaN confinement layer is grown.

When the growth of the low-temperature p-type GaN layer is completed, the temperature inside the reaction chamber is adjusted to 900° C.~1050° C., the pressure inside the reaction chamber is adjusted to 50 mBar~150 mBar, an aluminum (Al) source, the Ga source, and the Mg source are introduced, and the p-type AlGaN confinement layer is grown on the low-temperature p-type GaN layer. Growth of the p-type AlGaN confinement layer is completed until the p-type AlGaN confinement layer has a thickness of 40 nm~80 nm.

At block S804, the p-type GaN layer is grown.

When growth of the p-type AlGaN confinement layer is completed, the temperature inside the reaction chamber is adjusted to 850° C.~1000° C., the Ga source and the Mg source are introduced, and the p-type GaN layer is grown on the p-type AlGaN confinement layer. Growth of the p-type GaN layer is completed when the p-type GaN layer has a thickness of 40 nm~100 nm.

A display device of the disclosure is described in detail with an implementation below.

The display device includes a display backplane on which more than one LED chip is mounted, where each of the more than one LED chip is provided with the above-mentioned LED epitaxial structure.

In the description of the disclosure, descriptions with reference to terms "some implementations", "one implementation", "certain implementations", "examples", "specific examples", or "some examples", and the like mean that specific features, structures, materials, or characteristics described in combination with the implementations or examples are included in at least one implementation or example of the disclosure. The schematic expressions of the above terms herein do not necessarily refer to the same implementation or example. Moreover, the particular features, structures, materials, or characteristics described may be combined in any suitable manner in any one or more implementations or examples.

The above implementations are only preferred implementations of the disclosure and cannot be understood as limitations on the disclosure. Any modifications, replacements, improvements, etc. for the above implementations within the spirit and principle of the disclosure, should be considered to fall into the protection scope of the disclosure.

What is claimed is:

1. A superlattice layer, comprising:
   at least two superlattice units which are grown in stacking layers, wherein
   each of the at least two superlattice units comprises a first n-type gallium nitride (GaN) layer, a second n-type GaN layer, a first n-type gallium indium nitride (GaInN) layer, and a second n-type GaInN layer which are grown in stacking layers; and
   the first n-type GaN layer has a doping concentration which is constant along a growth direction, the second n-type GaN layer has a doping concentration which increases along the growth direction, the first n-type GaInN layer has a doping concentration which decreases along the growth direction, and the second n-type GaInN layer has a doping concentration which is constant along the growth direction.

2. The superlattice layer of claim 1, wherein the at least two superlattice units have 20 to 50 superlattice units, and all the at least two superlattice units have a total thickness ranging from 50 nm to 200 nm.

3. The superlattice layer of claim 2, wherein the first n-type GaN layer has a thickness greater than the second n-type GaN layer.

4. The superlattice layer of claim 3, wherein the first n-type GaN layer has a thickness ranging from 1 nm to 4 nm.

5. The superlattice layer of claim 3, wherein the second n-type GaN layer has a thickness ranging from 0.25 nm to 1 nm.

6. The superlattice layer of claim 2, wherein the first n-type GaInN layer has a thickness ranging from 0.25 nm to 1 nm.

7. The superlattice layer of claim 2, wherein the second n-type GaInN layer has a thickness ranging from 0.5 nm to 2 nm.

8. The superlattice layer of claim 1, wherein each of the first n-type GaN layer, the second n-type GaN layer, the first n-type GaInN layer, and the second n-type GaInN layer is doped with silicon.

9. A light emitting diode (LED) epitaxial structure, comprising a GaN buffer layer, an un-doped GaN layer, a bottom n-type GaN layer, a superlattice layer, a multi-quantum well (MQW) light-emitting layer, a low-temperature p-type GaN layer, a p-type aluminum gallium nitride (AlGaN) confinement layer, and a p-type GaN layer which are grown in stacking layers, the superlattice layer comprises at least two superlattice units which are grown in stacking layers, wherein
   each of the at least two superlattice units comprises a first n-type gallium nitride (GaN) layer, a second n-type GaN layer, a first n-type gallium indium nitride (GaInN) layer, and a second n-type GaInN layer which are grown in stacking layers; and
   the first n-type GaN layer has a doping concentration which is constant along a growth direction, the second n-type GaN layer has a doping concentration which increases along the growth direction, the first n-type GaInN layer has a doping concentration which decreases along the growth direction, and the second n-type GaInN layer has a doping concentration which is constant along the growth direction.

10. The LED epitaxial structure of claim 9, wherein
   the GaN buffer layer has a thickness ranging from 20 nm to 30 nm;
   the undoped GaN layer has a thickness ranging from 1500 nm to 3000 nm;
   the bottom n-type GaN layer has a thickness ranging from 2000 nm to 2500 nm;
   the MQW light-emitting layer has a thickness ranging from 80 nm to 240 nm;
   the low-temperature p-type GaN layer has a thickness ranging from 30 nm to 60 nm;
   the p-type AlGaN confinement layer has a thickness ranging from 40 nm to 80 nm; and
   the p-type GaN layer has a thickness ranging from 40 nm to 100 nm.

11. A method for manufacturing an LED epitaxial structure, comprising:
   providing a substrate;
   placing the substrate into a reaction chamber;
   growing sequentially a GaN buffer layer, an un-doped GaN layer, and a bottom n-type GaN layer on the substrate;
   introducing a Gallium (Ga) source and $SiH_4$ into the reaction chamber, and growing a first n-type GaN layer on the bottom n-type GaN layer;
   stopping introducing $SiH_4$ when growth of the first n-type GaN layer is completed, and growing a GaN layer on the first n-type GaN layer;
   stopping introducing the Ga source, and re-introducing a predetermined amount of $SiH_4$ when growth of the GaN layer is completed, to enable the GaN layer to form a second n-type GaN layer;

introducing the Ga source and an indium (In) source into the reaction chamber to form a first n-type GaInN layer;

re-introducing $SiH_4$ to form a second n-type GaInN layer, wherein the first n-type GaN layer, the second n-type GaN layer, the first n-type GaInN layer, and the second n-type GaInN layer form a superlattice unit;

growing a predetermined number of superlattice units on the superlattice unit formed until all the superlattice units have a total thickness reaching a predetermined value, to form a superlattice layer; and growing sequentially a MQW light-emitting layer, a low-temperature p-type GaN layer, a p-type AlGaN confinement layer, and a p-type GaN layer on the superlattice layer;

the first n-type GaN layer has a doping concentration which is constant along a growth direction, the second n-type GaN layer has a doping concentration which increases along the growth direction, the first n-type GaInN layer has a doping concentration which decreases along the growth direction, and the second n-type GaInN layer has a doping concentration which is constant along the growth direction.

12. The method for manufacturing the LED epitaxial structure of claim 11, comprising:

after growing sequentially the GaN buffer layer, the un-doped GaN layer, and the bottom n-type GaN layer on the substrate,
adjusting a temperature inside the reaction chamber to 800° C.~950° C.

13. The method for manufacturing the LED epitaxial structure of claim 12, wherein growing a predetermined number of superlattice units on the superlattice unit formed until all the superlattice units have a total thickness reaching a predetermined value comprises:

growing 20 to 50 superlattice units on the superlattice unit formed until all superlattice units have the total thickness ranging from 50 nm to 200 nm.

14. The method for manufacturing the LED epitaxial structure of claim 13, wherein placing the substrate in the reaction chamber comprises:

increasing the temperature inside the reaction chamber to 1000° C.~1200° C.;
introducing hydrogen gas; and
baking the substrate for 2 to 6 minutes.

15. The method for manufacturing the LED epitaxial structure of claim 14, wherein growing sequentially the GaN buffer layer, the un-doped GaN layer, and the bottom n-type GaN layer on the substrate comprises:

introducing the Ga source and ammonia gas into the reaction chamber, decreasing the temperature inside the reaction chamber to 500° C.~600° C., adjusting a pressure inside the reaction chamber to 400 mBar~700 mBar, and growing the GaN buffer layer on the substrate;

increasing the temperature inside the reaction chamber to 1000° C.~1200° C. when growth of the GaN buffer layer is completed, and growing a first un-doped GaN layer on the GaN buffer layer;

decreasing the pressure inside the reaction chamber to 200 mBar~350 mBar when growth of the first un-doped GaN layer is completed, growing a second un-doped GaN layer on the first un-doped GaN layer, wherein the first un-doped GaN layer and the second doped GaN layer form the un-doped GaN layer; and introducing $SiH_4$ when growth of the second un-doped GaN layer is completed, and growing the bottom n-type GaN layer on the second un-doped GaN layer.

16. The method for manufacturing the LED epitaxial structure of claim 15, wherein growing sequentially the MQW light-emitting layer, the low-temperature p-type GaN layer, the p-type AlGaN confinement layer, and the p-type GaN layer on the superlattice layer when growth of the superlattice layer is completed comprising:

adjusting the temperature inside the reaction chamber to 730° C.~900° C. and growing the MQW light-emitting layer;

adjusting the temperature inside the reaction chamber to 730° ° C.~830° C. when growth of the MQW light-emitting layer is completed, introducing the Ga source and a magnesium (Mg) source, and growing the low-temperature p-type GaN layer on the MQW light-emitting layer;

adjusting the temperature inside the reaction chamber to 900° C.~1050° C. and adjusting the pressure inside the reaction chamber to 50 mBar~150 mBar when growth of the low-temperature p-type GaN layer is completed, introducing an aluminum (Al) source, the Ga source, and the Mg source, and growing the p-type AlGaN confinement layer on the low-temperature p-type GaN layer; and adjusting the temperature inside the reaction chamber to 850° C.~1000° C. when growth of the p-type AlGaN confinement layer is completed, introducing the Ga source and the Mg source, and growing the p-type GaN layer on the p-type AlGaN confinement layer.

17. The method for manufacturing the LED epitaxial structure of claim 11, wherein the Ga source is trimethylgallium.

18. A display device, comprising a display backplane on which more than one LED chip is mounted, wherein each of the more than one LED chip is provided with the LED epitaxial structure of claim 9.

19. The display device of claim 18, wherein
the GaN buffer layer has a thickness ranging from 20 nm to 30 nm;
the undoped GaN layer has a thickness ranging from 1500 nm to 3000 nm;
the bottom n-type GaN layer has a thickness ranging from 2000 nm to 2500 nm;
the MQW light-emitting layer has a thickness ranging from 80 nm to 240 nm;
the low-temperature p-type GaN layer has a thickness ranging from 30 nm to 60 nm;
the p-type AlGaN confinement layer has a thickness ranging from 40 nm to 80 nm; and
the p-type GaN layer has a thickness ranging from 40 nm to 100 nm.

20. The display device of claim 18, wherein the at least two superlattice units have 20 to 50 superlattice units, and all the at least two superlattice units have a total thickness ranging from 50 nm to 200 nm.

* * * * *